(12) United States Patent
Kim (10) Patent No.: US 7,365,825 B2
(45) Date of Patent: Apr. 29, 2008

(54) LIQUID CRYSTAL DISPLAY DEVICE INCLUDING REPAIR PATTERN AND METHOD FOR FABRICATING THE SAME

(75) Inventor: Hyun Tae Kim, Kyoungsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 208 days.

(21) Appl. No.: 11/105,367

(22) Filed: Apr. 14, 2005

(65) Prior Publication Data

US 2005/0272178 A1    Dec. 8, 2005

(30) Foreign Application Priority Data

Apr. 14, 2004    (KR)    ............... 10-2004-0025859

(51) Int. Cl.
G02F 1/13    (2006.01)
(52) U.S. Cl. ............... 349/192; 349/139; 257/59
(58) Field of Classification Search .......... 257/72, 257/59, 66; 349/33, 42, 43, 54, 55, 139, 349/192
See application file for complete search history.

(56) References Cited

U.S. PATENT DOCUMENTS

| | | | | |
|---|---|---|---|---|
| 6,014,191 A * | 1/2000 | Kim et al. | ............ | 349/55 |
| 6,172,728 B1 * | 1/2001 | Hiraishi | ............ | 349/139 |
| 6,327,007 B1 * | 12/2001 | Shim | ............ | 349/54 |
| 2004/0125259 A1 * | 7/2004 | Cho | ............ | 349/43 |
| 2004/0141097 A1 * | 7/2004 | Takahara et al. | ............ | 349/38 |
| 2004/0239826 A1 * | 12/2004 | Park et al. | ............ | 349/43 |

FOREIGN PATENT DOCUMENTS

| | | |
|---|---|---|
| KR | 10-2002-0054852 A | 8/2002 |
| KR | 10-2002-0092722 A | 12/2002 |

\* cited by examiner

*Primary Examiner*—Zandra V. Smith
*Assistant Examiner*—Paul E Patton
(74) *Attorney, Agent, or Firm*—McKenna Long & Aldridge, LLP

(57) ABSTRACT

An LCD device including: a gate line on a substrate along a first direction; a data line in a second direction perpendicular to the gate line to define a unit pixel region, wherein the data line has recesses on a first side of the data line; a repair pattern having ends crossing the data line at the recesses of the data line; a thin film transistor adjacent to a crossing of the gate line and the data line, the thin film transistor including a semiconductor layer, a gate electrode, a drain electrode and a source electrode; a passivation layer over an entire surface of the substrate including the thin film transistor; and a pixel electrode connected to the drain electrode through the passivation layer.

20 Claims, 11 Drawing Sheets

LIQUID CRYSTAL DISPLAY DEVICE INCLUDING REPAIR PATTERN AND METHOD FOR FABRICATING THE SAME

This application claims the benefit of the Korean Application No. P2004-25859 filed on Apr. 14, 2004, which is hereby incorporated by reference.

BACKGROUND OF THE INVENTION

1. Field of the Invention

The present invention relates to a liquid crystal display (LCD) device, and more particularly, to an LCD device and a method for fabricating the same, to improve the picture quality.

2. Discussion of the Related Art

With the recent development of high-technology image display apparatuses, such as high definition televisions, various types of flat panel display devices have been actively researched and developed. The various types of flat panel display devices include, for example, a liquid crystal display (LCD) device, an electro-luminescence display (ELD), a vacuum fluorescent display (VFD), and a plasma display panel (PDP). Among the various types of flat display devices, the LCD device has been most widely used due its advantageous characteristics of thin profile, light weight, and low power consumption. In effect, the LCD device has become a substitute for the Cathode Ray Tube (CRT). For example, LCD devices are being used in car-mounted monitors and as monitors for color televisions as well as laptop computers and pocket computers.

In general, the LCD device includes an upper substrate that is referred to as a color filter array substrate, a lower substrate that is referred to as a thin film transistor array substrate, and a liquid crystal layer. The lower and upper substrates are bonded to each other, and the liquid crystal layer having dielectric anisotropy is formed between the lower and upper substrates. The thin film transistor array substrate includes a plurality of gate lines, a plurality of data lines, a plurality of pixel electrodes formed in pixel regions, and a plurality of thin film transistors. The color filter array substrate includes a color filter layer and a common electrode.

The plurality of gate lines on the thin film transistor array substrate are formed perpendicular to the plurality of data lines, to define a plurality of pixel regions. Also, each of the plurality of thin film transistor is formed adjacent to a crossing point of the gate and data lines such that each thin film transistor applies a data signal of the data line to each pixel electrode in response to a scanning signal of the gate line. A storage capacitor is formed with an adjacent gate line adjacent to the pixel electrode or an additional storage line such that the storage capacitor can maintain a voltage on the pixel electrode until the next scanning signal.

The storage capacitor maintains the voltage on the pixel electrode during a turn-off block of time for the corresponding thin film transistor as result of charge stored in the storage capacitor so as to prevent the picture quality from degrading when the thin film transistor is turned off. The storage capacitor can have a storage-on-common structure or a storage-on-gate structure. In the case of the storage-on-common structure, an additional electrode for the storage capacitor is formed. The additional electrode is connected to the common electrode. In the storage-on-gate structure, some area of the $(n-1)_{th}$ adjacent gate line is used as the electrode for the storage capacitor of the $n_{th}$ pixel region.

Figure 1:
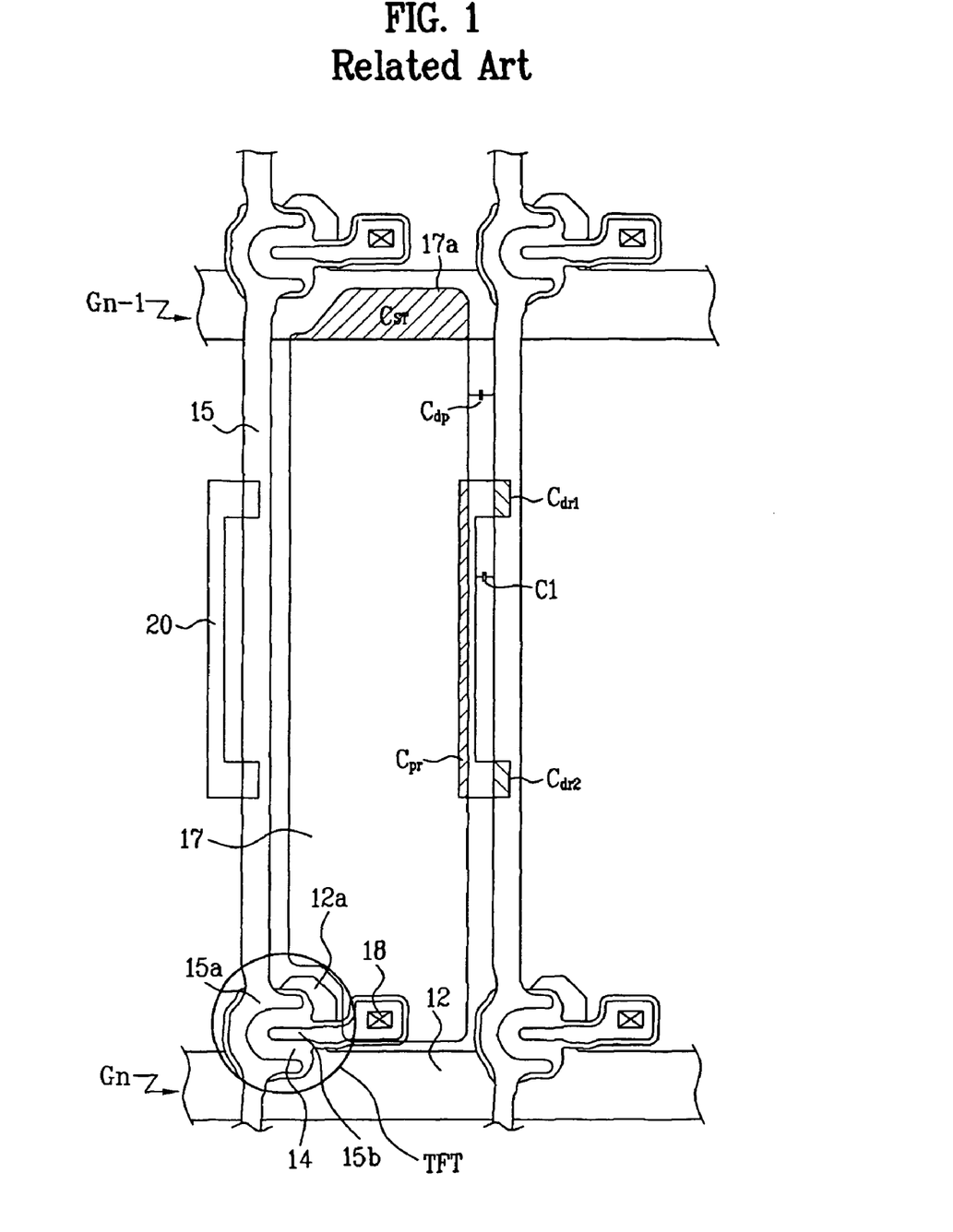
FIG. 1 is a plan view of an LCD device according to the related art.
Figure 2:
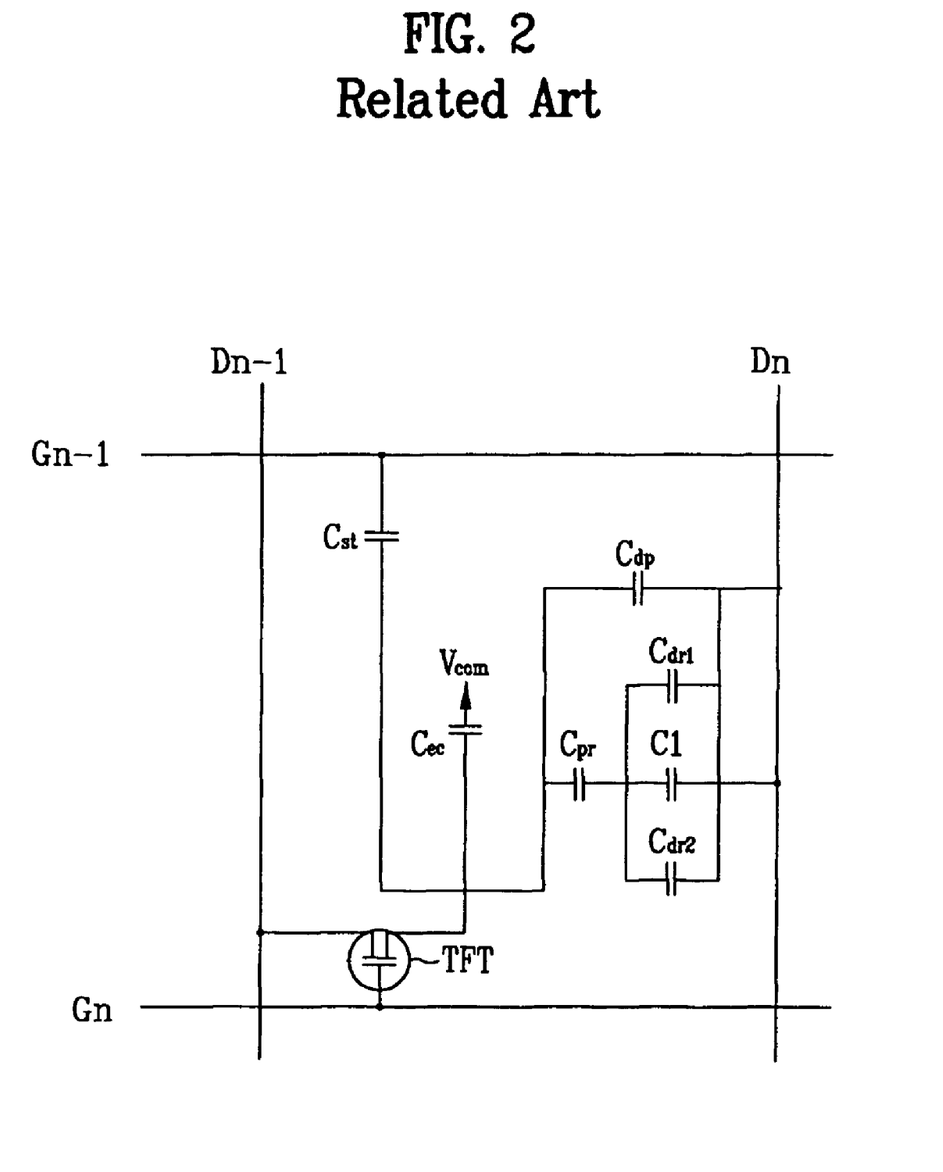
FIG. 2 is an equivalent circuit diagram of a unit pixel according to the related art.
Figure 3:
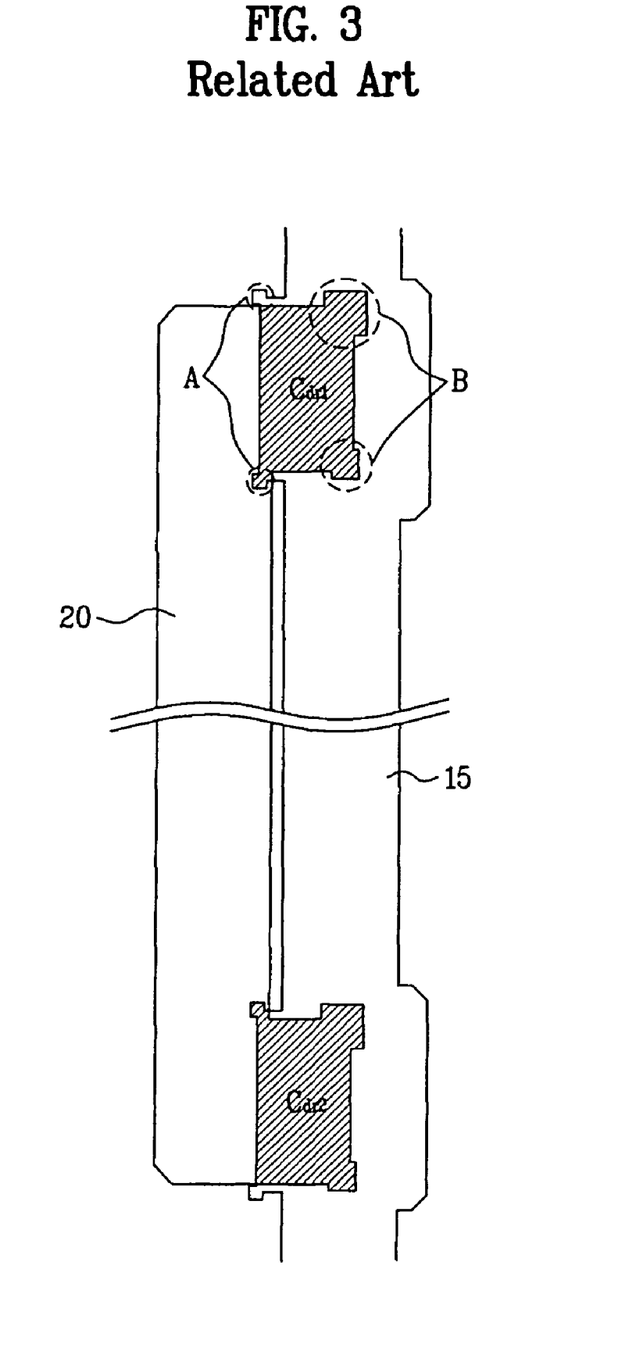
FIG. 3 is an expanded plan view of a repair area according to the related art.

A related art LCD device and a method for fabricating the same will be described with reference to FIGS. 1, 2, and 3. FIG. 1 is a plan view of an LCD device according to the related art. FIG. 2 is an equivalent circuit diagram of a unit pixel according to the related art. FIG. 3 is an expanded plan view of a repair area according to the related art.

The related art LCD device includes a thin film transistor array substrate, a color filter array substrate, and a liquid crystal layer. The liquid crystal layer is formed between the thin film transistor array substrate and the color filter array substrate, which are bonded to each other. As shown in FIG. 1, the thin film transistor array substrate includes a plurality of gate lines Gn 12, a gate insulating layer (not shown), data lines 15, thin film transistors TFTs, a passivation layer (not shown), a pixel electrode 17, a capacitor electrode 17a, and a C-shaped repair pattern 20. The plurality of gate lines Gn 12 transmit scanning signals. A gate insulating layer (not shown) is formed over the entire surface of the thin film transistor array substrate including the gate lines Gn 12. The data lines 15 are for transmitting video signals and are formed in a direction perpendicular to the gate lines Gn 12. Each of the thin film transistors TFTs is formed adjacent to where one of the gate lines 12 and one of the data lines 15 cross. A passivation layer (not shown) is formed over the entire surface of the thin film transistor array substrate including the thin film transistors TFTs.

In each pixel region, the pixel electrode 17 for the pixel region is electrically connected via a drain electrode 15b to the thin film transistor TFT of the pixel region. The capacitor electrode 17a, which generates a storage capacitance, is formed by the capacitor electrode 17a portion of the pixel electrode 17 overlapping the adjacent gate line Gn-1 12. The C-shaped repair pattern 20 has both ends overlapped by the data line 15 and a middle portion overlapped by the pixel electrode 17 of an adjacent pixel region. The C-shape repair pattern 20 is formed such that the data line 15 can be repaired if the data line 15 has defects or is disconnected.

Each of the thin film transistors TFTs include a gate electrode 12a, a gate insulating layer (not shown) a semiconductor layer 14, a source electrode 15a, and a drain electrode 15b. The gate electrode 12a is a portion of the gate line 12. The gate insulating layer (not shown) is formed over the gate electrode 12a. The semiconductor layer 14 is formed over the gate insulating layer above the gate electrode 12a. The source electrode 15a, which is fabricated along with the data line 15, overlaps one side of the semiconductor layer 14. The drain electrode 15b is formed at a predetermined interval from the source electrode on the other side of the semiconductor layer 14. In this case, the semiconductor layer 14 is formed in an island-shape above the gate electrode 12a. The semiconductor layer 14 can be extended beyond the outer sides of the data line 15 as well as over the gate electrode 12a.

The repair pattern 20 is formed in the same layer as the gate line 12. If the predetermined portions of the data line 15, overlapping both ends of the repair pattern 20, are disconnected by tests for line defects and point defects or are otherwise determined to be defective, a laser can be irradiated onto the predetermined portions of the data line 15, overlapping both ends of the repair pattern 20, to repair the data line 15. More specifically, the laser irradiation electrically connects the repair pattern 20 to the data line 15 so as to rewire around any defects or openings in the data line 15.

As shown in FIG. 3, the data line 15 overlaps both ends of the repair pattern 20. The data line 15 has protrusions that improve the success of connecting the data line 15 to the repair pattern 20 with a laser. The protrusions of the data line 15 overlap both ends of the repair pattern. Further, the protrusions of the data line 15 have optical compensation patterns A to prevent over-etching of the corners of the protrusion. The repair pattern 20 has optical compensation patterns B at both ends of the repair pattern 20 to prevent over-etching of the corners of the ends of the repair pattern 20 and that also improve the success of connecting the data line 15 to the repair pattern 20 with a laser.

The storage capacitor $C_{st}$ represented in FIG. 2 includes the storage electrode 17a, the adjacent gate line Gn-1 as well as a gate insulating layer and a passivation layer. More particularly, the gate insulating layer and the passivation layer are formed between the storage electrode 17a and the adjacent gate line Gn-1. The storage capacitor $C_{st}$ maintains the pixel voltage during the time block when the thin film transistor is turned off.

The storage capacitor $C_{st}$ has lower and upper electrodes with the gate insulating layer and the passivation layer between the lower and upper electrodes. The size of the storage capacitor may be changed by changing the size of the lower electrode, the size of the upper electrode or the thickness of the insulating layer. However, other voltages of the thin film transistor array substrate, as shown in FIG. 1 and FIG. 2, generate various parasitic capacitances Cdp, Cpr, Cdr1, Cdr2, and Cdr3 in addition to the capacitance across the liquid crystal Clc and the storage capacitance $C_{st}$.

As shown in FIG. 1 and FIG. 2, Cdp is the parasitic capacitance generated in the predetermined interval between the data line 15 and the pixel electrode 17. Cpr, Cdr1, Cdr2, and C1 are the parasitic capacitances generated by the repair pattern 20, which are generated when the data signal is transmitted through the repair pattern 20. More specifically, Cpr is the parasitic capacitance generated by the pixel electrode 17 and the portion of the repair pattern 20 overlapped by the pixel electrode 17. Also, Cdr1 and Cdr2 are the parasitic capacitances generated by the data line 15 overlapping the portions of the repair pattern 20. C1 is the parasitic capacitance generated in the interval between the data line 15 and the repair pattern 20.

The repair pattern 20 is formed in the same layer as the adjacent gate line Gn-1 and is also formed adjacent to the adjacent gate line Gn-1. Typically, when a voltage is not directly applied to the repair pattern 20, there are no parasitic capacitances between the repair pattern 20 and the data line 15. However, if a voltage of about 25V is applied to the adjacent gate line Gn-1, a voltage can be induced into the repair pattern 20. Thus, parasitic capacitances can be generated between the repair pattern 20 and the data line 15 when a large voltage is applied to an adjacent gate line Gn-1 of a pixel region.

A parasitic capacitance may cause a D.C. voltage offset to an A.C. voltage applied to the liquid crystal layer, $\Delta Vp$, thereby generating flicker, image sticking, and non-uniformity of luminance in the images. In other words, $\Delta Vp$ changes will depend upon the parasitic capacitance for a pixel region when the gate voltage is changed from Vgh to Vgl, as shown in the following equation.

$$\Delta Vp = \frac{(Cdp + Cpr + Cdr1 + Cdr2 + C1)}{(Cdp + Cpr + Cdr1 + Cdr2 + C1) + Cst + Clc}(Vgh - Vgl)$$

As the parasitic capacitance increases, the effect on the voltage difference $\Delta Vp$ of the liquid crystal layer also increases to the point that the picture image may become unstable.

In order to decrease parasitic capacitance Cdp generated between the data line 15 and the pixel electrode 17, the distance between the pixel electrode 17 and the data line 15 can be increased. However, in case of decreasing the pattern width of the pixel electrode 17 to increase the distance between the data line and the pixel electrode, the aperture ratio will be lowered. Decreasing the pattern width of the pixel electrode 17 to increase the distance between the pixel electrode and the data line in a high-definition display device is impractical since the quality of a high-definition display device is very dependent on the aperture ratio.

The size of both ends of the repair pattern can be decreased to reduce the parasitic capacitance Cdr1 and Cdr2 generated by the repair pattern 20. However, the dimensions of the ends of the repair pattern 20 overlapped the data line 15 can only be diminished to a certain degree. More particularly, the dimensions of the ends can only be reduced to a point where the repair success ratio still remains acceptable.

The optical compensation patterns A and B of FIG. 3 are provided to prevent corners from being overly decreased by an over-etch. More specifically, the optical compensation pattern A is formed on a protrusion of the data line 15 where the repair pattern 20 crosses under the data line 15. For reference, the size of the optical compensation pattern may be changed to a scanning direction by exposure.

The related art LCD device has several disadvantages. First, the voltage difference $\Delta Vp$ increases due to the parasitic capacitance generated by the repair pattern. As a result, malfunctions appear in the display at pixel regions in which such parasitic capacitance occurs. Secondly, parasitic capacitance is additionally formed by the optical compensation patterns A and B where the optical compensation patterns A are formed on the protrusion of the data line and where the optical compensation patterns B are formed on both ends of the repair pattern. Third, the insulating layers formed between the repair pattern and the data line may not be uniformly consistent or aligned. Accordingly, the deviations in parasitic capacitance amongst the pixel regions may be generated due to such misalignments or inconsistencies such that it is impossible to realize a uniform luminance across the picture image.

SUMMARY OF THE INVENTION

Accordingly, the present invention is directed to an LCD device and a method for fabricating the same that substantially obviates one or more problems due to limitations and disadvantages of the related art.

An object of the present invention is to provide an LCD device and a method for fabricating the same, to minimize a parasitic capacitance in a repair area.

Another object of the present invention is to provide an LCD device and a method for fabricating the same to improve the picture quality by stabilizing a charging voltage Vrms applied to a unit pixel.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an liquid crystal display device includes a gate line on a substrate along a first direction; a data line in a second direction perpendicular to the gate line to define a unit pixel region, wherein the data line has recesses on a first side of the data line; a repair pattern having ends crossing the data line at the recesses of the data line; a thin film transistor adjacent to a crossing of the gate line and the data line, the thin film transistor including a semiconductor layer, a gate electrode, a drain electrode and a source electrode; a passivation layer over an entire surface of the substrate including the thin film transistor; and a pixel electrode connected to the drain electrode through the passivation layer.

In another aspect, an liquid crystal display device includes: a gate line on a substrate along a first direction; a data line in a second direction perpendicular to the gate line to define a unit pixel region, wherein the data line has recesses on a first side of the data line and a protrusions on a second side corresponding to the recesses on the first side; a repair pattern having an end crossing the data line at the recesses of the data line; a thin film transistor adjacent to a crossing of the gate line and the data line, the thin film transistor including a semiconductor layer, a gate electrode, a drain electrode and a source electrode; a passivation layer over an entire surface of the substrate including the thin film transistor; and a pixel electrode connected to the drain electrode through the passivation layer.

In another aspect, a method for fabricating an liquid crystal display device includes: forming a gate line and a gate electrode on a substrate along with a repair pattern having ends; forming a gate insulating layer over an entire surface of the substrate including the gate line; forming a semiconductor layer over the gate insulating layer above the gate electrode; forming a data line perpendicular to the gate line along with source and drain electrodes, wherein the data line has recesses along one side overlapping the ends of the repair pattern; forming a passivation layer over the entire surface of the substrate including the data line; and forming a pixel electrode connected to the drain electrode through the passivation layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

DETAILED DESCRIPTION OF THE PREFERRED EMBODIMENTS

Reference will now be made in detail to the preferred embodiments of the present invention, examples of which are illustrated in FIGS. 4, 5, 6, 7, and 8A-8D. Wherever possible, the same reference numbers will be used throughout the drawings to refer to the same or like parts.

Figure 4:
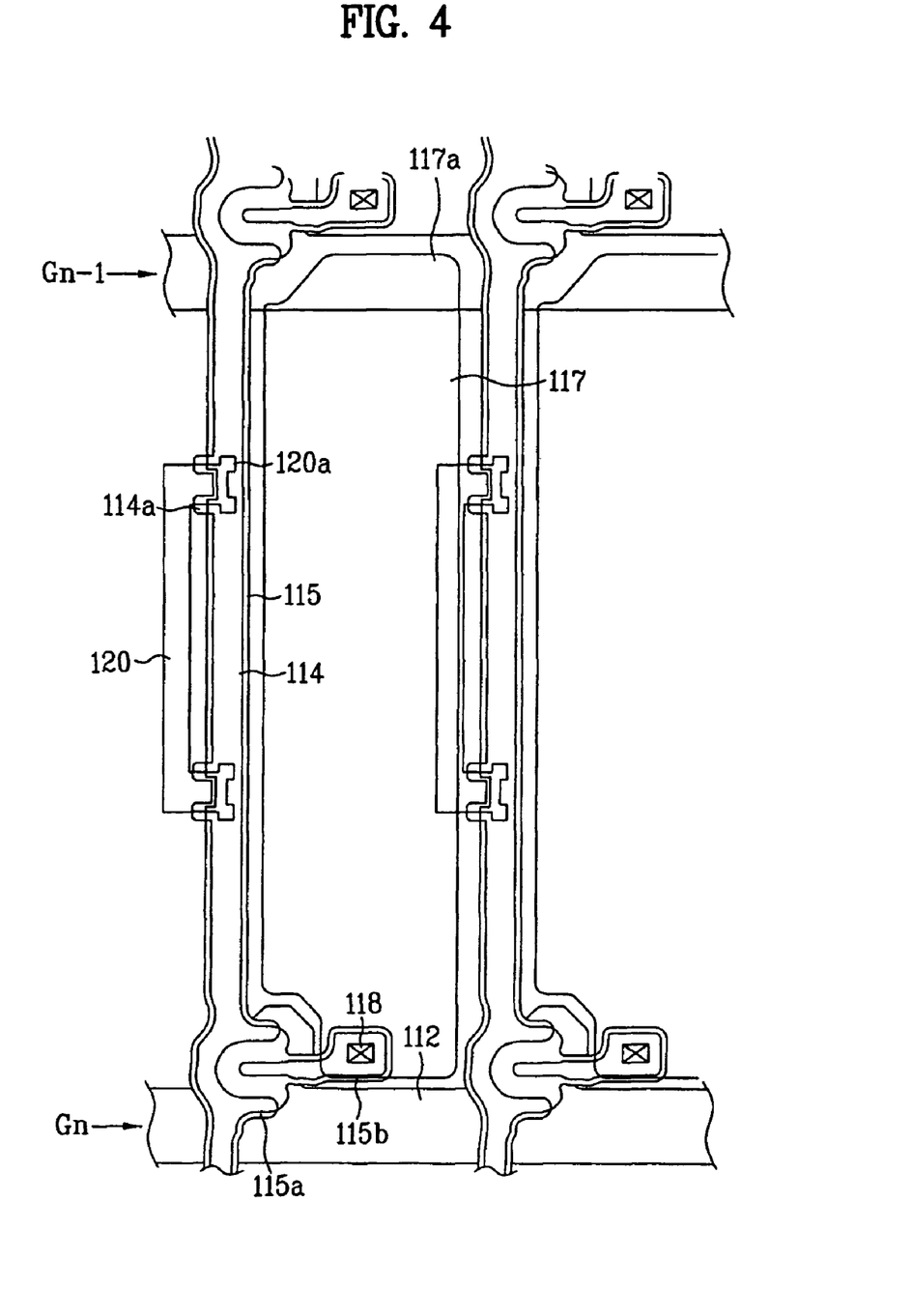
FIG. 4 is a plan view of an LCD device according to a first exemplary embodiment of the present invention.
Figure 5:
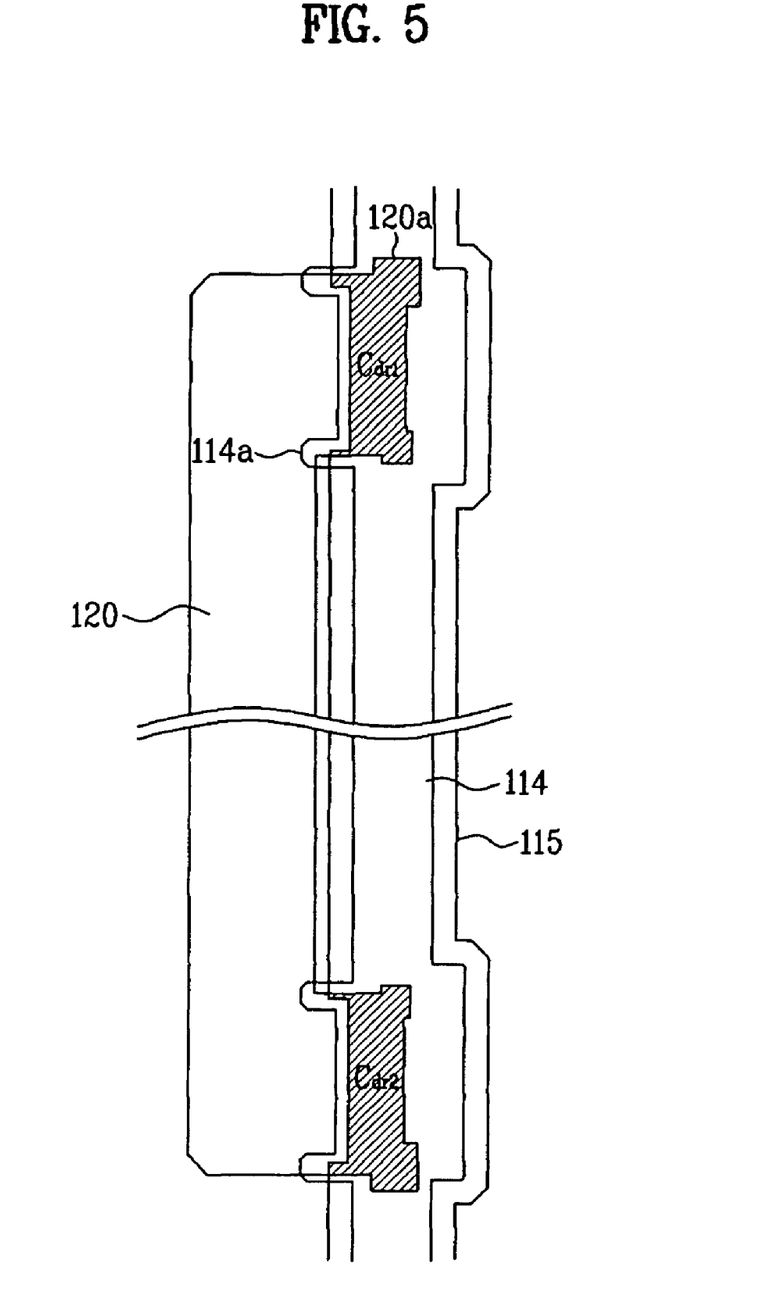
FIG. 5 is an expanded plan view of a repair area according to the first exemplary embodiment of the present invention.
Figure 7:
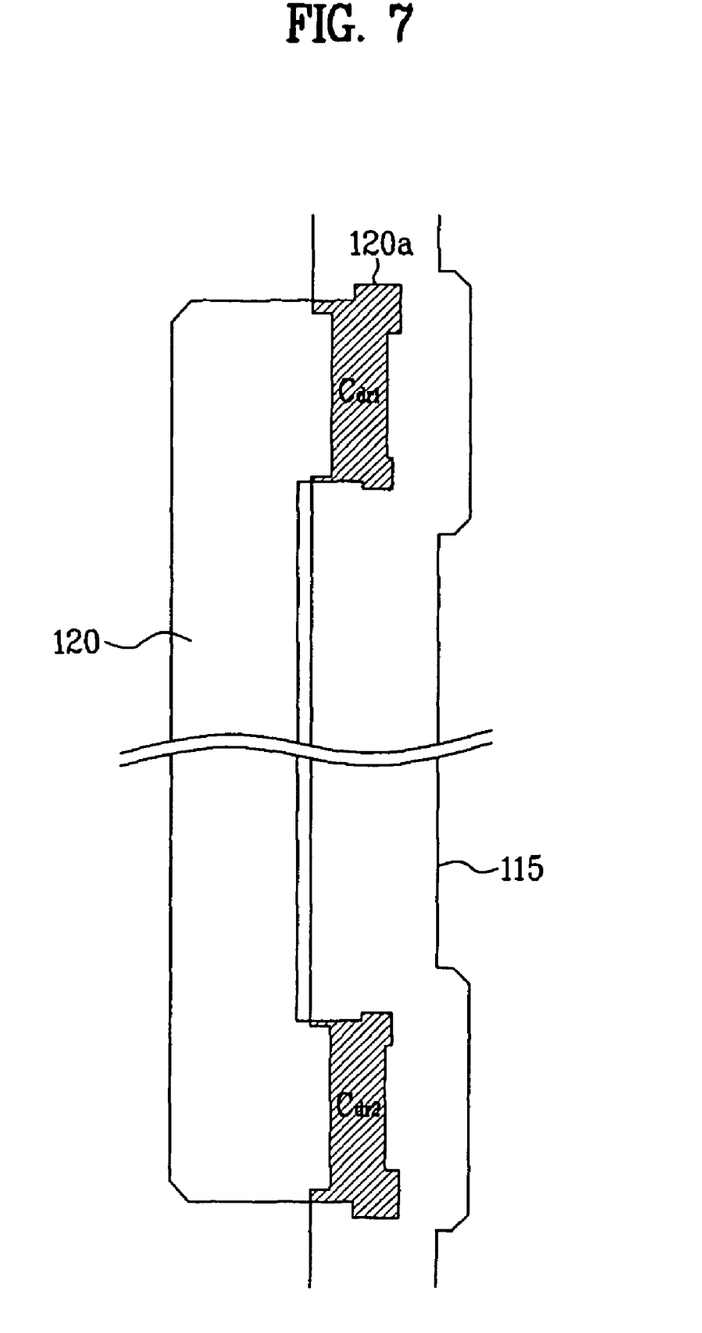
FIG. 7 is an expanded plan view of a repair area according to a third exemplary embodiment of the present invention.

FIG. 4 is a plan view of an LCD device according to a first exemplary embodiment of the present invention. FIG. 5 is an expanded plan view of a repair area according to the first exemplary embodiment of the present invention. FIG. 7 is an expanded plan view of a repair area according to a third exemplary embodiment of the present invention.

As shown in FIG. 4, a thin film transistor array substrate of an LCD device according to a first exemplary embodiment of the present invention includes a plurality of gate lines Gn 112, a C-shaped repair pattern 120, a plurality of data lines 115, thin film transistors TFTs, pixel electrodes 117, and capacitor electrodes 117a. The plurality of gate lines Gn 112 are arranged in one direction and the plurality of data lines 115 are perpendicularly arranged in a second direction to define pixel regions. Also, the C-shaped repair pattern 120 is formed in the same layer as the gate line 112 such that both ends of the C-shaped repair pattern 120 are overlapped by portions of the data line 115. Each of the plurality of data lines 115 have recesses in portions overlapping the ends of the repair pattern 120 so as to minimize the overlap between the data line and the repair pattern. Each of the thin film transistors is formed in a pixel region adjacent to the crossing point of one of the gate lines 112 and one of the data lines 115. A pixel electrode 117 is formed in each pixel region. The pixel electrode 117 is connected to a drain electrode 115b of the thin film transistor TFT. The capacitor electrode 117a is formed by an extension of pixel electrode 117 overlapping the adjacent gate line Gn-1 112 such that the capacitor electrode 117a generates a storage capacitance with the adjacent gate line Gn-1 112.

Without decreasing dimensions CD of the repair pattern 120 to a point where the repair success ratio of the data line is unacceptable and without effectively decreasing the width of the data line 115, the recesses are formed in repair areas of the data line 115 along with protrusions also formed in the data line 115 opposite to the recesses and outside of the repair area. The recesses reduces the parasitic capacitance of the repair pattern 120 to the data line 115 and the protrusions in the data line maintain the current carrying capacity of the data line. Thus, the recesses can be formed in the data line 115 to reduce parasitic capacitance between the repair pattern 120 and the data line 115 while maintaining both an acceptable repair success ratio and the current carrying capacity of the data line 115.

Although not shown, a gate insulating layer (not shown) is additionally formed between the gate line 112 and the data line 115, wherein the gate insulating layer (not shown) is formed of an inorganic insulating material, for example, silicon nitride ($SiN_x$) or silicon oxide ($SiO_x$) by PECVD. In addition, a passivation layer (not shown) is formed between the thin film transistor and the pixel electrode 117, wherein the passivation layer (not shown) may be formed by a method of depositing an inorganic insulating material, for example, silicon nitride ($SiN_x$) and silicon oxide ($SiO_x$). In the alternative, the passivation layer may be formed by a method of coating an organic insulating material, for example, BCB (BenzoCycloButene) and acrylic materials.

The thin film transistor controls a voltage applied to the unit pixel region. The thin film transistor includes a gate electrode 112a, the gate insulating layer, a semiconductor layer 114, and source and drain electrodes 115a and 115b. The gate electrode 112a extends from the gate line 112. A gate insulating layer is formed over the entire surface of the thin film transistor array substrate including the gate electrode 112a.

The semiconductor layer 114 is formed by a method of sequentially depositing amorphous silicon a-Si and n$^+$a-Si on the gate insulating layer such that n$^+$a-Si is formed by implanting impurity ions into the amorphous silicon. The source and drain electrodes 115a and 115b are formed on the semiconductor layer 114 above the gate line 112. The semiconductor layer 114 of the thin film transistor TFT extends under the lower side of the data line 115, and is positioned between the repair pattern 120 and the data line 115 to assist in continuity along the data line 115.

The semiconductor layer 114 extends into the recesses of the data line 115 and other portions of the semiconductor layer 114 extend as protrusions along sides of the ends of the repair pattern 120. There are several benefits resulting from the semiconductor layer 114 extending into the recesses of the data line 115. First, the semiconductor layer extending into the recesses assists in maintaining the current carrying capacity of the data line 115. Second, the semiconductor layer extending into the recesses improves the repair success ratio. Third, the semiconductor layer extending into the recesses prevents deviations of parasitic capacitance in case the semiconductor layer and the data line have different degrees of alignment within each pixel region.

An example of an alignment error is when the edges of the semiconductor layer are suppose to be formed in correspondence to edges of the data line, but the edge of semiconductor layer may be positioned inside the data line due to a manufacturing error. In this case, the parasitic capacitance may be different for a first pixel region having the edge of the semiconductor layer aligned along the edge of the data line, and an other portion having no semiconductor layer between the repair pattern and the data line because of a misalignment of an edge of the semiconductor layer along the edge of the data line. To prevent such an occurrence, the semiconductor layer has a larger width than the data line in the repair area to prevent a small degree of misalignment from causing deviations of parasitic capacitance amongst or in the pixel regions.

At the edges of the repair pattern 120, the gate insulating layer is relatively thinner due to a step difference of the repair pattern 120. In the process of patterning the data line 115 perpendicular to the repair pattern 120, an etchant for etching the data line 115 may permeate through the thin gate insulating layer to the repair pattern 120, thereby opening the repair pattern 120. To prevent this problem, the semiconductor layer 114 is extended as protrusions along both sides of the repair pattern 120 from where the repair pattern 120 and the data line 115 cross. The protruding portion of the semiconductor layer 114 is an opening prevention pattern 114a. Accordingly, since the opening prevention pattern 114a has a predetermined thickness along both edges of the repair pattern 120, it is possible to prevent the etchant for the data line from penetrating through the gate insulating layer. An optical compensation pattern 120a is formed in corners of the ends of the repair pattern 120 to prevent the corner areas of the repair pattern 120 from being decreased even in case of an over-etch.

In the first exemplary embodiment of the present invention, as shown in FIG. 5, the repair pattern 120 has the optical compensation pattern 120a like the related art but there is no optical compensation pattern like the A shown in FIG. 3. However, the recesses are formed in a repair area of the data line with a corresponding protrusion of the data line outside of the repair area to minimize the overlapped area between the repair pattern 120 and the data line 115 and maintaining the current carrying capacity of the data line.

Figure 6:
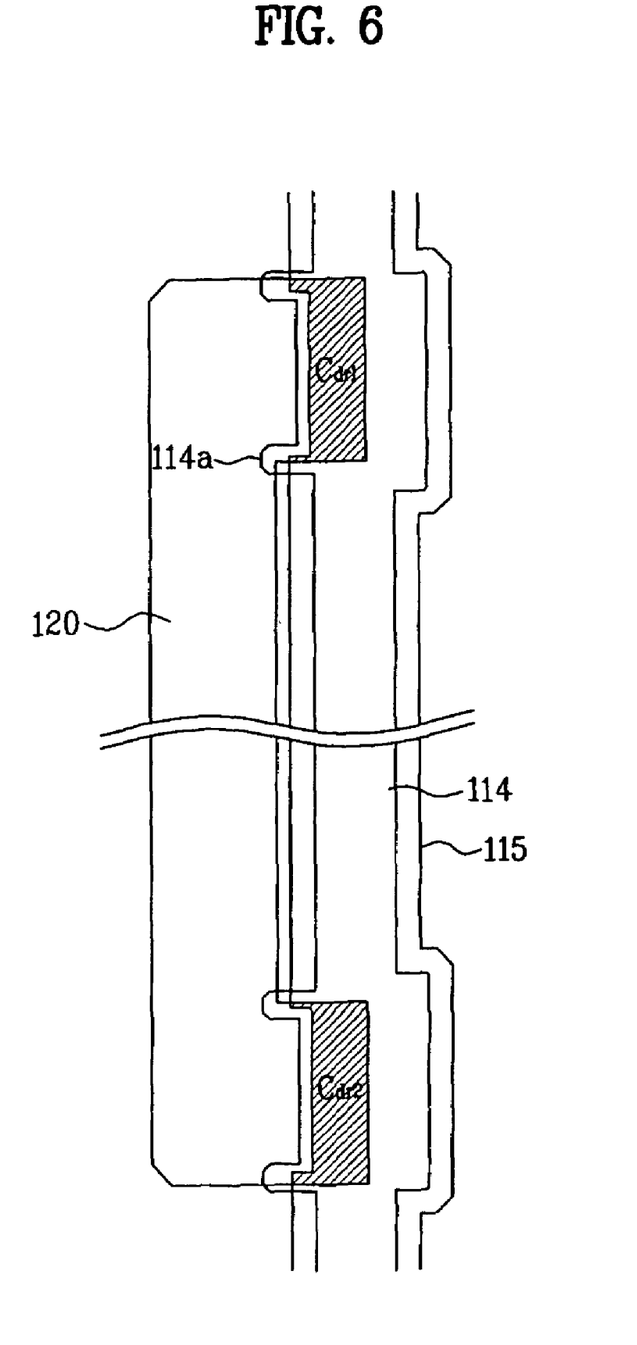
FIG. 6 is an expanded plan view of a repair area according to a second exemplary embodiment of the present invention.

FIG. 6 is an expanded plan view of a repair area according to a second exemplary embodiment of the present invention. In the second exemplary embodiment, an optical compensation pattern, shown as A in FIG. 3, is not on the data line 115, and the recesses are formed in the repair area of the data line with a corresponding protrusion of the data line formed outside of the repair area. In addition, an optical compensation pattern, shown as 120a in FIG. 5, is not on the corners of the repair pattern 120 so as to further minimize the parasitic capacitance generated between the repair pattern and the data line. In this case, it is important to maintain a sufficiently large repair area and/or prevent over-etching to keep an acceptable repair success ratio.

In the above first and second exemplary embodiments of the present invention, the semiconductor layer 114 has an opening prevention pattern 114a extending as protrusions along both edges of the repair pattern from where the repair pattern crosses the data line. FIG. 7 is an expanded plan view of a repair area according to a third exemplary embodiment of the present invention. In the third exemplary embodiment of the present invention, the semiconductor layer is not under the lower side of the data line 115. Instead, just an island-shaped semiconductor layer 114 is formed to be used as a channel region for the thin film transistor. As a result, it is possible to prevent the parasitic capacitance from being different in the respective pixel regions due to varying alignment degrees of the semiconductor layer 114 with respect to the data line 115.

A method for fabricating the LCD device according to exemplary embodiments of the present invention will be described as follows. FIG. 8A to FIG. 8D are plan views of the fabrication process for an LCD device according to exemplary embodiments of the present invention.

Figure 8A:
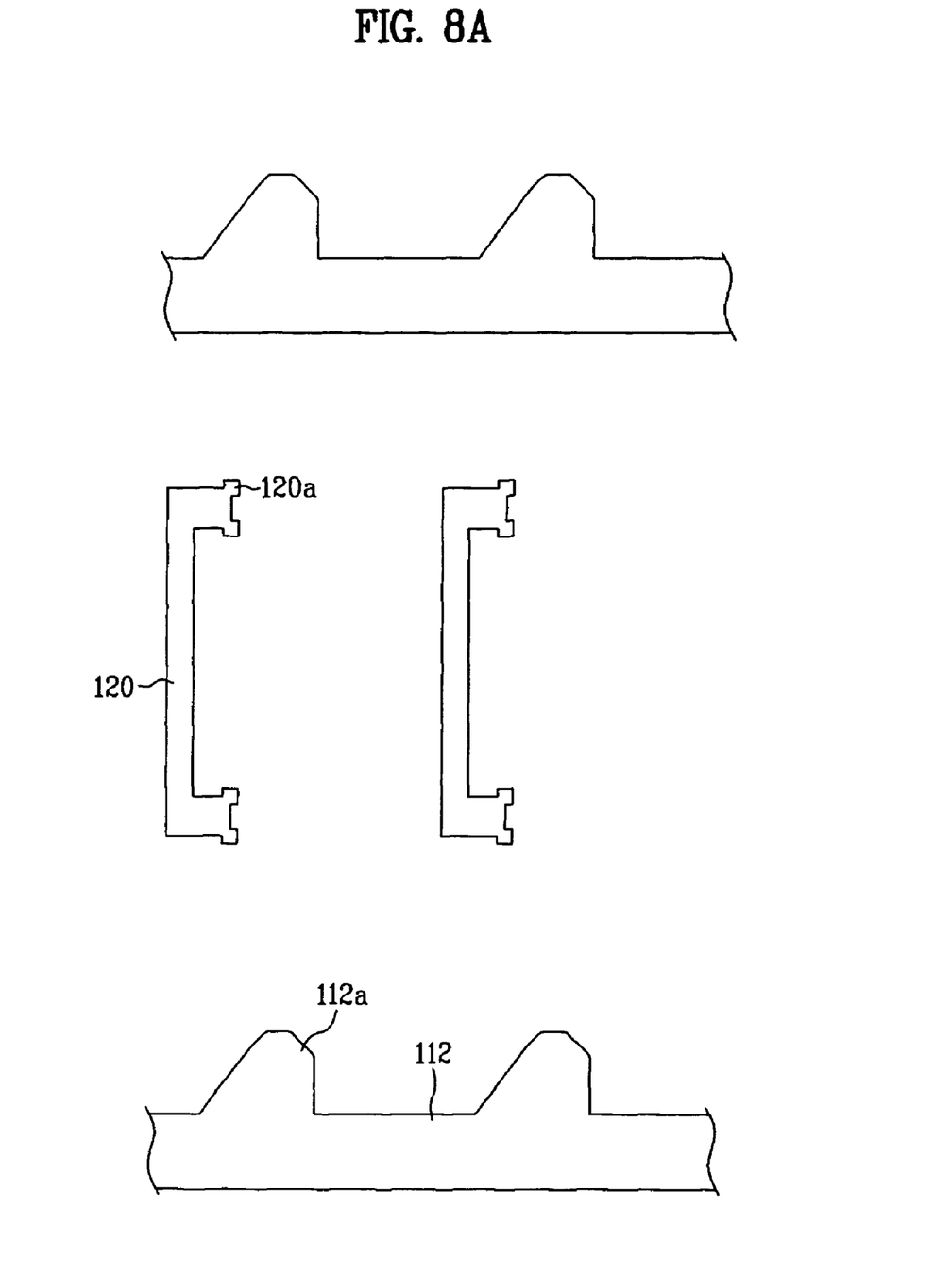
FIG. 8A to FIG. 8D are plan views of the fabrication process for an LCD device according to exemplary embodiments of the present invention.

As shown in FIG. 8A, to prevent signal delay, a metallic material having low resistivity, such as copper (Cu), aluminum (Al), aluminum neodymium (AlNd), molybdenum (Mo), chrome (Cr), titanium (Ti), tantalum (Ta), or molybdenum-tungsten (MoW), is deposited on the thin film transistor array substrate. The deposited metal material is then patterned to form the plurality of gate lines 112, the gate electrode 112a, and the repair pattern 120.

At this time, the repair pattern 120 is formed in a C-shape, such as a blocked 'ㄷ' shape, so that both ends of the repair pattern 120 are overlapped by portions of the data line 115. Then, if it is determined that the data line 115 is disconnected during a test, the portions of the data line 115 overlapping the repair pattern 120 are welded to the repair pattern 120 with a laser to repair the opening in the data line 115.

An optical compensation pattern 120a is designed to be at the corners of the ends of the repair pattern 120. Thus, even when the corners of the repair pattern 120 is over-etched, the overall size of the repair pattern 120 will not be overly decreased. In the second exemplary embodiment of the present invention, the optical compensation pattern 120a is not formed on the ends of repair pattern 120, as shown in FIG. 6.

After the repair pattern 120 is formed, an inorganic insulating material, such as silicon oxide ($SiO_x$) or silicon nitride ($SiN_x$) is deposited over the entire surface of the thin film transistor array substrate, including the gate line 112, by PECVD to form the gate insulating layer (not shown).

Figure 8B:
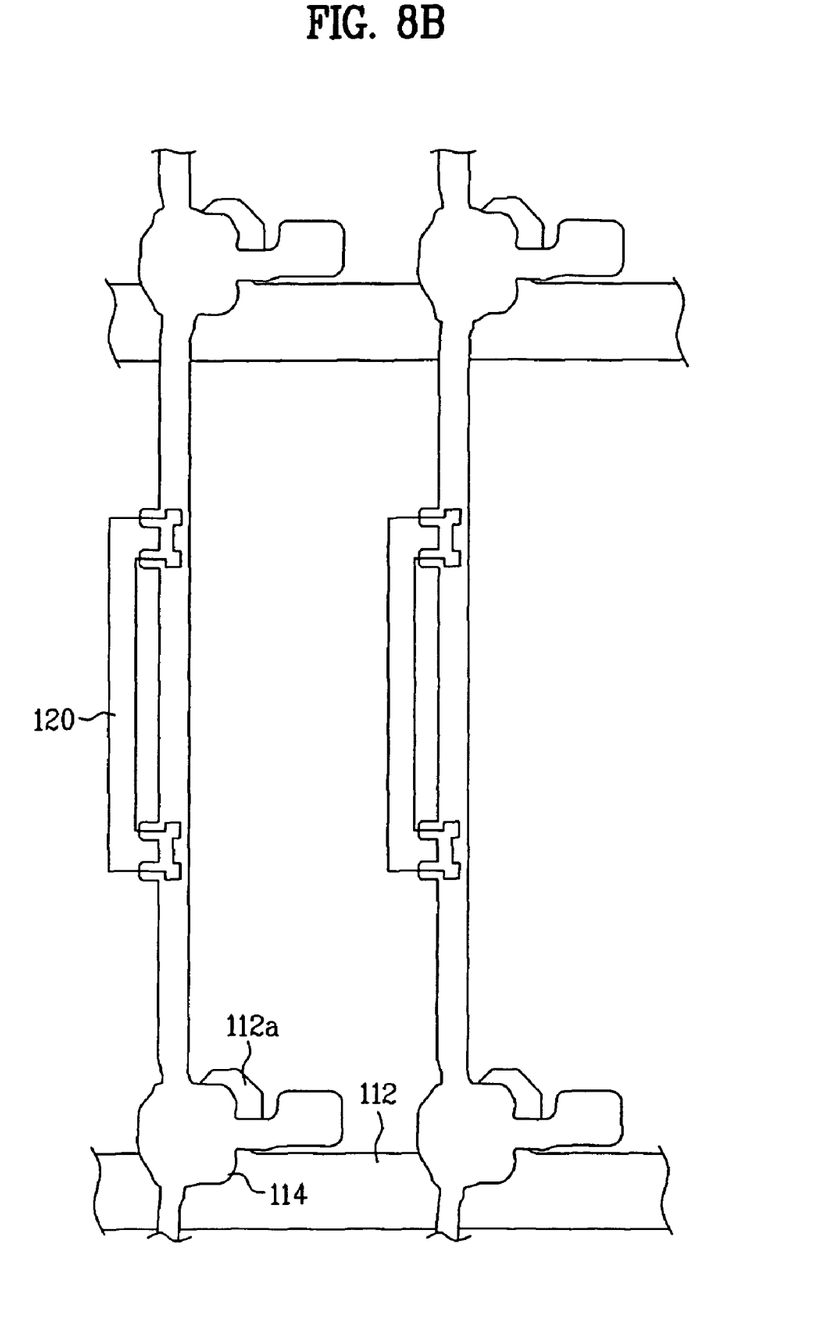

Subsequently, as shown in FIG. 8B, amorphous silicon (a-Si:H) is deposited at a high temperature over the entire surface of the thin film transistor array substrate, including the gate insulating layer, and then the deposited amorphous silicon is patterned to form the semiconductor layer 114 on the gate insulating layer.

The semiconductor layer 114 may be formed in an island-shaped pattern on a predetermined portion of the gate electrode 112a, such as shown in FIG. 7 of the third exemplary embodiment, or the semiconductor layer 114 may be overlapped with the data line and the source and drain electrodes, such as shown in FIG. 5 and FIG. 6 of the first and second exemplary embodiments, respectively.

When the semiconductor layer 114 is overlapped with the data line 115, in the overlapped portion between the repair pattern 120 and the data line 115, the semiconductor layer 114 generally protrudes out from under the data line 115. Especially, along both sides of the ends of the repair pattern 120, the protruding portion of the semiconductor layer 114 is formed as an opening prevention pattern 114a.

An overcoat layer may be additionally formed on the semiconductor layer 114. More particularly, the overcoat layer is formed by a method of doping impurity ions on amorphous silicon. The overcoat layer lowers a contact resistance to the source and drain electrodes.

Figure 8C:
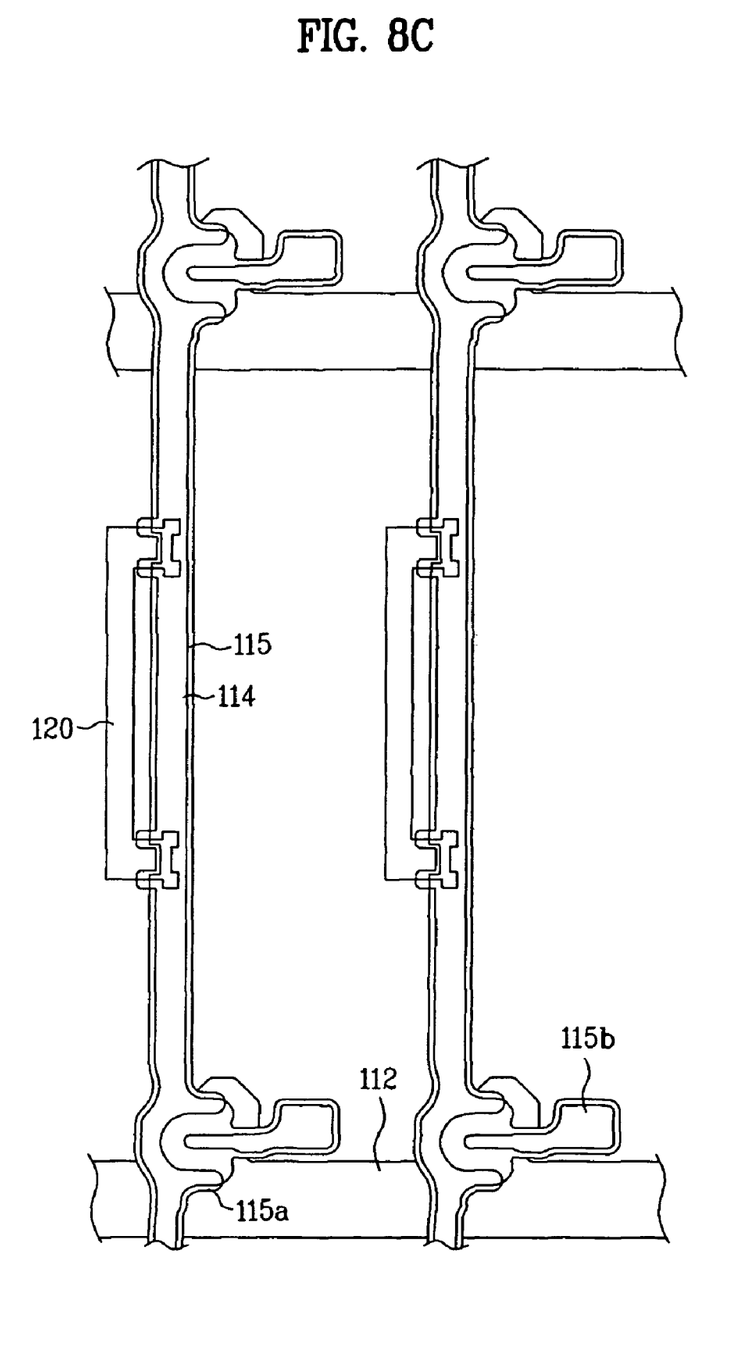

Subsequently, as shown in FIG. 8C, metallic material, for example, copper (Cu), aluminum (Al), aluminum-neodymium (AlNd), molybdenum (Mo), chrome (Cr), titanium (Ti), tantalum (Ta), or molybdenum-tungsten (MoW) is deposited over the entire surface of the thin film transistor array substrate including the semiconductor layer 114, and then the deposited metal material is patterned, thereby forming the plurality of data lines 115 and the source and drain electrodes 115a and 115b.

The data line 115 has at least two recesses in portions overlapping the repair pattern 120. Thus, it is possible to decrease the size of the overlapped portion between the repair pattern and the data line, thereby minimizing the parasitic capacitance. In the portion of the data line 115 corresponding to the recesses, the semiconductor layer 114 extends into the recesses and outside of the data line 115. That is, the semiconductor layer 114 in the repair area projects past the edge of the data line 115 to prevent the problem of deviation in the parasitic capacitance by the misalignment of the semiconductor layer 114 with the data line 115.

The source electrode 115a is formed in a U-shape. The drain electrode 115b is inserted into the inside of the U-shaped source electrode 115a. Accordingly, it is possible to complete the thin film transistor including the gate electrode 112a, the gate insulating layer, the semiconductor layer 114, and the U-shaped source and drain electrodes 115a and 115b.

Figure 8D:
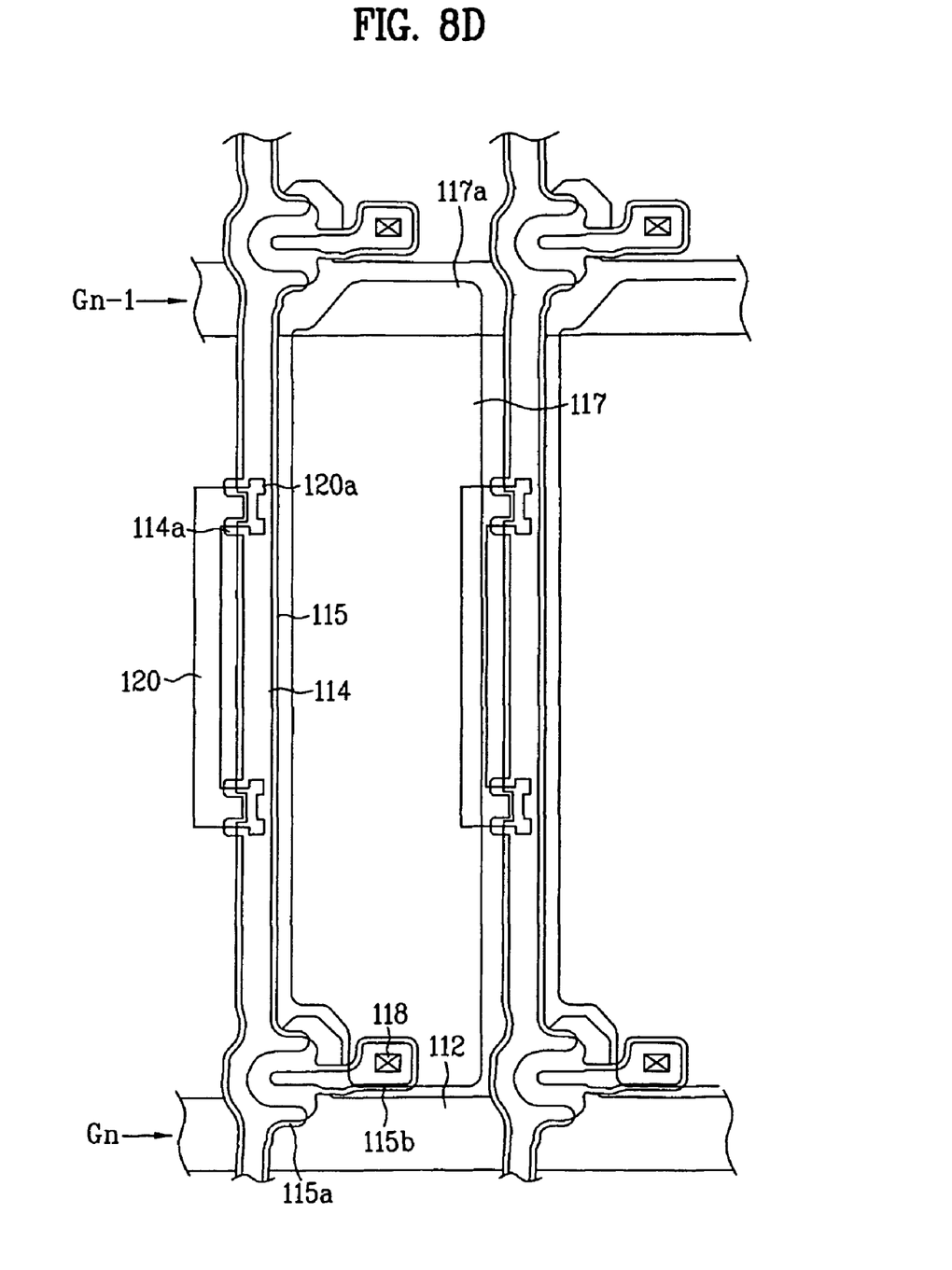

As shown in FIG. 8D, an organic insulating material, such as BCB or acrylic resin, may be coated on the entire surface of the thin film transistor array substrate including the data line 115, or inorganic insulating material, such as $SiN_x$ or $SiO_x$, may be deposited on the entire surface of the thin film transistor array substrate including the data line 115 to form the passivation layer (not shown).

After forming a contact hole 118 for exposing the drain electrode 115b by partially removing the passivation layer (not shown), a transparent conductive material, such as ITO (Indium Tin Oxide) or IZO (Indium Zinc Oxide) is deposited and patterned over the entire surface of the thin film transistor array substrate including the passivation layer. As a result, it is possible to form the pixel electrode 117 being electrically connected to the drain electrode 115b through the contact hole 118 of the passivation. The pixel electrode 117 can extend toward the adjacent gate line Gn-1 to form the capacitor electrode 117a. Accordingly, the capacitor electrode 117 and the adjacent gate line form the storage capacitor.

After completion of the thin film transistor array, line-opening tests are performed by line defect and/or point defect tests. If there is any opening in the data line 115, the data line 115 is welded to the repair pattern 120 by laser, thereby repairing the disconnection of the data line 115.

Although not shown, the thin film transistor array substrate is positioned opposite to another substrate and bonded to each other. Then, a liquid crystal layer is formed between the two substrates. In this case, the opposite substrate has a black matrix layer for preventing light leakage, a color filter layer with R, G and B color resists in-between the black matrix layer, an overcoat layer formed on the color filter layer to protect the color filter layer as well as to planarize the surface of the color filter layer, and a common electrode formed on the overcoat layer to form the electric field with the pixel electrode of the thin film transistor array substrate.

As mentioned above, the LCD device and the method for fabricating the same according to the exemplary embodiments of the present invention has several advantages. First, it is possible to decrease the area of the data line overlapped by the repair pattern while maintaining the repairing success ratio. Secondly, the parasitic capacitance between the repair pattern and the data line is minimized. As a result, the charging voltage $\Delta Vp$ applied to the unit pixel regions is stabilized, which prevent defects in the picture images. Thirdly, the semiconductor layer as well as the gate insulating layer are formed in between the data line and the repair pattern with the semiconductor layer extending out past the semiconductor layer. As a result, it is possible to decrease the deviation of the parasitic capacitance amongst or in the unit pixel regions, generated by small degrees of misalignment between the semiconductor layer and the data line. Fourth, the semiconductor layer formed between the repair pattern and the data line improves the repair success ratio. Fifth, the opening prevention pattern of the semiconductor layer along the edges of the repair pattern prevents the repair pattern from being disconnected during an etching of the data line.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An liquid crystal display device comprising:
   a gate line on a substrate along a first direction;
   a data line in a second direction perpendicular to the gate line to define a unit pixel region, wherein the data line has recesses on a first side of the data line;
   a repair pattern having a center portion positioned at a distance from the data line and ends crossing the data line at the recesses of the data line, wherein the repair pattern is formed in the same layer as the gate line;

a thin film transistor adjacent to a crossing of the gate line and the data line, the thin film transistor including a semiconductor layer, a gate electrode, a drain electrode and a source electrode;

a passivation layer over an entire surface of the substrate including the thin film transistor; and a pixel electrode connected to the drain electrode through the passivation layer.

2. The liquid crystal display device of claim 1, further comprising a optical compensation patterns formed in corners of the ends of the repair pattern.

3. The liquid crystal display device of claim 1, wherein the semiconductor layer of the thin film transistor extends under a lower side of the data line.

4. The liquid crystal display device of claim 3, wherein the semiconductor layer extends into the recesses of the data line.

5. The liquid crystal display device of claim 3, wherein the semiconductor layer has an opening prevention pattern extending along an edge of the repair pattern.

6. The liquid crystal display device of claim 5, wherein the opening prevention pattern extends as protrusions along both edges of the repair pattern from where the repair pattern crosses the date line.

7. The liquid crystal display device of claim 1, wherein the repair pattern has a C-shape.

8. The liquid crystal display device of claim 7, wherein the C-shape is a blocked 'C'-shape.

9. The liquid crystal display device of claim 1, wherein the data line has protrusions on a second side corresponding to the recesses on the first side.

10. An liquid crystal display device comprising:
a gate line on a substrate along a first direction;
a data line in a second direction perpendicular to the gate line to define a unit pixel region, wherein the data line has recesses on a first side of the data line and protrusions on a second side corresponding to the recesses on the first side;
a repair pattern having a center portion positioned at a distance from the data line and ends crossing the data line at the recesses of the data line, wherein the repair pattern is formed in the same layer as the gate line;
a thin film transistor adjacent to a crossing of the gate line and the data line, the thin film transistor including a semiconductor layer, a gate electrode, a drain electrode and a source electrode;
a passivation layer over an entire surface of the substrate including the thin film transistor; and
a pixel electrode connected to the drain electrode through the passivation layer.

11. The liquid crystal display device of claim 10, wherein the semiconductor layer extends under the data line and into the recesses of the data line.

12. A method for fabricating an liquid crystal display device comprising:
forming a gate line and a gate electrode on a substrate along with a repair pattern having a center portion and ends;
forming a gate insulating layer over an entire surface of the substrate including the gate line;
forming a semiconductor layer over the gate insulating layer above the gate electrode;
forming a data line perpendicular to the gate line along with source and drain electrodes, wherein the data line has recesses along one side overlapping the ends of the repair pattern, wherein the data line is positioned at a distance from the center portion of the repair pattern;
forming a passivation layer over the entire surface of the substrate including the data line; and
forming a pixel electrode connected to the drain electrode through the passivation layer.

13. The method of claim 12, further comprising: forming the semiconductor layer to extend under a lower side of the data line.

14. The method of claim 13, further comprising: forming the semiconductor layer to extend into the recesses of the data line.

15. The method of claim 12, further comprising:
forming the semiconductor layer to have an opening prevention pattern extending along an edge of the repair pattern.

16. The method of claim 15, further comprising:
forming the opening prevention pattern to extend as protrusions along both edges of the repair pattern from where the repair pattern crosses the data line.

17. The method of claim 12, further comprising: forming optical compensation patterns at the corners of both ends of the repair pattern.

18. The method of claim 12, further comprising: forming the repair pattern has a C-shape.

19. The method of claim 18, further comprising: forming the C-shape to be a blocked 'C'-shape.

20. The method of claim 12, further comprising:
forming protrusions on a second side of the data line corresponding to the recesses on the first side of the data line.

* * * * *